US010983187B2

(12) United States Patent
Gentz et al.

(10) Patent No.: US 10,983,187 B2
(45) Date of Patent: Apr. 20, 2021

(54) MEASURING BRIDGE ARRANGEMENT WITH IMPROVED ERROR DETECTION

(71) Applicant: Ypsomed AG, Burgdorf (CH)

(72) Inventors: Michael Gentz, Burgdorf (CH); Thomas Buri, Burgdorf (CH); Stefan Lindegger, Huttwil (CH); Markus Oberli, Kirchberg (CH)

(73) Assignee: Ypsomed AG, Burgdorf (CH)

( * ) Notice: Subject to any disclaimer, the term of this patent is extended or adjusted under 35 U.S.C. 154(b) by 511 days.

(21) Appl. No.: 15/684,420

(22) Filed: Aug. 23, 2017

(65) Prior Publication Data
US 2017/0350955 A1 Dec. 7, 2017

Related U.S. Application Data

(63) Continuation of application No. PCT/CH2016/000022, filed on Jan. 28, 2016.

(30) Foreign Application Priority Data

Mar. 3, 2015 (CH) .......................... 286/15

(51) Int. Cl.
*G01R 35/00* (2006.01)
*G01D 3/08* (2006.01)
(Continued)

(52) U.S. Cl.
CPC ............... *G01R 35/00* (2013.01); *G01D 3/08* (2013.01); *G01K 7/206* (2013.01); *G01R 17/105* (2013.01);
(Continued)

(58) Field of Classification Search
CPC .......... G01D 3/08; G01K 7/206; G01R 17/10; G01R 17/105; G01R 31/2829; G01R 33/09; G01R 35/00
See application file for complete search history.

(56) References Cited

U.S. PATENT DOCUMENTS 3,840,807 A * 10/1974 Zschimmer ............. H03M 1/00
324/111
5,461,319 A 10/1995 Peters
(Continued)

FOREIGN PATENT DOCUMENTS

EP 2269009 B1 12/2011
EP 2511713 A1 10/2012
(Continued)

OTHER PUBLICATIONS

PCT International Search Report dated Apr. 13, 2016, for Application No. PCT/CH2016/000022, 4 pages.
(Continued)

*Primary Examiner* — Son T Le
*Assistant Examiner* — Adam S Clarke
(74) *Attorney, Agent, or Firm* — Dorsey & Whitney LLP

(57) ABSTRACT

Disclosed is a measuring bridge arrangement containing: a measuring bridge comprising at least one first half bridge having a first measuring connection and a second half bridge having a second measuring connection; a reference voltage divider having at least one first and a second test connection; a differential amplifier having at least one first and a second amplifier input and at least one amplifier output, a voltage amplification, and having an output voltage working range. In the arrangement, the first amplifier input is wired to a first capacitor and the second amplifier input is wired to a second capacitor, and the amplifier inputs can be selectively connected to the measuring connections or to the test connections.

17 Claims, 2 Drawing Sheets

(51) Int. Cl.
*G01K 7/20* (2006.01)
*G01R 33/09* (2006.01)
*G01R 31/28* (2006.01)
*G01R 17/10* (2006.01)

(52) U.S. Cl.
CPC ......... *G01R 31/2829* (2013.01); *G01R 33/09* (2013.01); *G01R 17/10* (2013.01)

(56) References Cited

U.S. PATENT DOCUMENTS

| | | | | |
|---|---|---|---|---|
| 5,469,071 | A * | 11/1995 | Obata | G01R 17/105 324/713 |
| 6,545,613 | B1 | 4/2003 | Hornback | |
| 8,149,002 | B2 | 4/2012 | Ossart et al. | |
| 2012/0306557 | A1* | 12/2012 | Lin | H03H 7/32 327/283 |
| 2013/0093431 | A1* | 4/2013 | Raman | G01L 1/144 324/537 |
| 2014/0375135 | A1* | 12/2014 | Nervegna | H03M 3/496 307/86 |
| 2015/0236648 | A1* | 8/2015 | Ahmad | H03F 3/45977 330/84 |
| 2015/0249888 | A1* | 9/2015 | Bogdanov | H03F 3/181 381/98 |
| 2015/0293155 | A1* | 10/2015 | Joet | G01R 17/105 324/706 |
| 2017/0350955 | A1* | 12/2017 | Gentz | G01D 3/08 |

FOREIGN PATENT DOCUMENTS

| | | |
|---|---|---|
| WO | 8905447 A1 | 6/1989 |
| WO | 9901777 A1 | 1/1999 |
| WO | 2014170051 A1 | 10/2014 |

OTHER PUBLICATIONS

PCT International Preliminary Report on Patentability dated Sep. 5, 2017 for Application No. PCT/CH2016/000022, 7 pages.

* cited by examiner

MEASURING BRIDGE ARRANGEMENT WITH IMPROVED ERROR DETECTION

CROSS-REFERENCE TO RELATED APPLICATIONS

This application is a continuation of International Application No. PCT/CH2016/000022 filed Jan. 28, 2016, which claims priority to Swiss Application No. 286/15 filed Mar. 3, 2015, the contents of all of which are herein incorporated by reference.

FIELD OF THE INVENTION

This invention in general concerns measuring bridge arrangements such as are used to detect physical quantities, for instance pressure, force, temperature, magnetic field. Such measuring bridge arrangements contain a plurality of resistive, piezoresistive, or magnetoresistive elements, which can be connected as a Wheatstone bridge. In particular, the invention concerns devices and methods for detection of error conditions in the measuring bridge, the leads, and the signal processing. Error detection is imperative in critical safety applications such as in automotive or medical technology. For example, administration devices like insulin pumps or automatic injectors must have a measuring device to detect an occlusion in the administration path, for which pressure or force sensors are advantageously used. Since detection of an occlusion is a critical function, a defect or an error function of the measuring device must be realized.

BACKGROUND OF THE INVENTION

A circuit for monitoring the function of a piezoresistive Wheatstone sensor bridge circuit is disclosed in the PCT application of International Publication Number WO99/01777 A1. If the compared signals deviate by more than an acceptable amount, the output of a window comparator sends an alarm signal. Up to a certain extent the disclosed circuit monitors the bridge resistances and the connection to an ASIC. However, said cited state of the art is complicated and relatively expensive. The approach in the cited prior art requires two separate processing circuits, which must be stable and adjusted precisely over time and temperature.

A measuring transducer for process instrumentation in which the status of a substrate, which carries the measuring resistors of a sensor for generation of a measuring signal, is monitored for changes resulting from chemical contamination, is known from EP2269009 B1. In addition, the measuring resistors and their connecting lines are monitored for breakage, i.e., for electrical interruption. The detection of a sensor break can, for example, take place via a complicated measurement of the current consumption of the measuring resistors connected to a Wheatstone bridge.

The invention from WO2014170051 A1 concerns a measuring transducer for process instrumentation having a sensor for detecting a physical or chemical quantity, where the sensor has measuring resistors connected to a Wheatstone bridge for generating an analogous measuring signal. To conduct a measuring transducer diagnosis, a center tap of at least one first voltage divider of the Wheatstone bridge is connected temporarily to ground by a series circuit of at least one first resistor and one first switch. With the open or closed first switch, a control and evaluation device determines the relevant values of a digital measuring signal, which was obtained from the analogous measuring signal by means of an analog-digital converter. If the deviation of the two values lies outside of a predetermined tolerance range, an error of the measuring transducer, in particular the analog-digital converter (ADC), is detected and displayed. This has the advantage that a second analog-digital converter for monitoring the analog-digital converter for error functions is not necessary. This prior art does not teach a measuring transducer diagnosis that is independent of the state of the sensor.

SUMMARY OF THE INVENTION

It is an aim of this invention to make available devices and methods that perform the detection of errors in a measuring bridge arrangement more simply and cheaply than the teachings in the above prior art. Another aim according to one development of the invention is to provide an alarm when an error arises in a measuring bridge arrangement.

The invention according to one of its structural aspects can be summarized as follows: a measuring bridge arrangement for a variable input quantity, for example force, containing a measuring bridge with two half bridges, each with a measuring terminal between which a differential bridge voltage can be registered as a measuring signal, independent of the value of the input quantity. Further, there is a reference voltage divider with two test terminals, between which a predetermined test differential voltage can be registered as a test signal. Further, there are two controllable switches for the measuring or test signals and a differential amplifier, whose output signal can lead to an analog-digital converter. The amplifier inputs are each connected to a capacitor. Embodiments and methods according to the invention result from the independent claims, while advantageous developments and applications of the invention result from the dependent claims.

GENERAL DESCRIPTION OF INVENTION

The measuring bridge is constructed of four or more, in particular, resistive elements, of which at least one, advantageously two, elements change their resistive value due to the influence of the varying input quantity. The measuring bridge is supplied with power by a reference voltage with respect to a ground. In the case of matched half bridges, a common mode voltage is present with respect to ground at the measuring terminals, on which the input quantity-dependent differential bridge voltage is superimposed, and which can be read as a measuring signal Ua between the half bridges.

The reference voltage divider is constructed of three or more series-connected resistors and is supplied with power by an additional reference voltage with respect to a ground, advantageously by the same reference voltage as the measuring bridge. With respect to the reference voltage, a value-proportional partial voltage is established via the resistors, of which one can be read at the test terminals via one or more resistors.

The differential amplifier has at least two amplifier inputs, of which one is a noninverting amplifier input and one is an inverting amplifier input. The differential amplifier has a predetermined voltage amplification of 1 to 100,000, advantageously 10 to 10,000, still more advantageously 100 to 1000, for example, 123 (as amplifier gain). The input resistances of the amplifier inputs are advantageously many times higher than the internal resistances of the measuring bridge and the reference voltage divider. The output voltage operating range available at the amplifier output is advantageously usable without distortion over nearly the entire voltage range from ground to an amplifier supply potential, which advantageously corresponds to the reference voltage of the measuring bridge or is in a predetermined proportional relationship to it, advantageously through the use of a so-called "rail-to-rail instrument amplifier."

The voltage at the amplifier output can be sent to an analog-digital converter. Its reference voltage is advantageously identical to the amplifier supply potential. The analog-digital converter converts the signal-proportional voltage values at its input, upon demand or periodically, to discrete numerical values, where a minimal value can correspond to the ground potential and a maximum value to the reference voltage. These values are available for a subsequent digital processing, in particular for comparisons, calculations, storage, or display. In particular, such an additional processing can take place under program control in a controller or computer.

An amplifier input can be connected as desired to a measuring terminal on the measuring bridge or to a test terminal on the reference voltage divider via switches, which advantageously are designed as so-called "analog switches" in semiconductor technology. Here the non-inverting and the inverting inputs of the differential amplifier are each connected to a switch. If both switches are in their normal first position, the switches can, for example, apply the measuring signal from the measuring bridge to the amplifier inputs. In their actuated second position, the switches can then, for example, apply the test signal from the reference voltage divider to the amplifier inputs. According to the invention, the switches can additionally also be actuated or set such that, for example, a first switch connects a noninverting amplifier input to a measuring terminal on the measuring bridge and at the same time a second switch connects an inverting amplifier input to the test terminal on the reference voltage divider. Suitable analog switches are advantageously available integrated in groups as so-called "multiplexers." Separate or joint actuation or setting of the switch position of the switches can advantageously take place through digital signals, which can be program controlled by a controller or computer.

According to the invention, capacitors are provided at the amplifier inputs. These take, with sufficient precision, the potential of a connected measuring or test terminal, in dependence, as is known, on their capacitance C and the effective internal resistance R of the connected voltage source after certain time constants $\tau$, advantageously after 5 $\tau$ or even 10 $\tau$, where the time constant is calculated according to the formula:

$$\tau = RC$$

A measuring or test potential that is turned on can thus be amplified with sufficient precision after an appropriate charge time and can be further processed as described above.

If the voltage source is turned off or a connecting lead is broken, the acquired potential will at first still be present at the amplifier input because of the capacitor charge, or will decrease very slowly by comparison with the charging process, and can be amplified with sufficient precision at the start of the slow discharge, and processed further as described above. The time constant $\tau'$ is again calculated as if the capacitance C is the same:

$$\tau' = R'C$$

In doing so, for the slow discharge, the advantageously very high effective internal resistance R' gives the determining parameter via the amplifier input resistance, the capacitor insulation, the switch insulation, and via additional insulation resistances. According to the invention, therefore, the effective internal resistance R of the measuring bridge and the reference voltage divider should be selected to be considerably smaller than the effective internal resistance R', for example 100 to 1,000,000 times smaller. The capacitor can advantageously have a capacitance from 1 to 100 nF, for example 10 nF. In the case of very high or very low effective internal resistances, the capacitor can correspondingly be chosen to be even smaller or even larger.

The described measuring bridge arrangement allows a first method according to the invention for diagnosis of the signal processing, in particular of the differential amplifier and the analog-digital converter, as well as the integrity of the connections of these elements. The reference voltage divider in this case is advantageously dimensioned through the appropriate choice of resistance values such that the voltage value of the test signal that can be read at the test terminals is greater than the bridge differential voltage that maximally arises as measuring signal in normal operation Uamax. Here, the voltage amplification G of the differential amplifier should be dimensioned so that the initial voltage is smaller than the upper end of the output voltage working range, advantageously in the vicinity of the upper end of the output voltage working range. Correspondingly, a first target range for plausible values of the differential voltage between the first test terminal and the second test terminal multiplied by the voltage amplification can be established. In operation, now, when required, the switches can be applied to the test terminals through the control signals, and after the sufficiently long time for charging the capacitor described above, the voltage value at the amplifier output can be evaluated and a first error state can be detected if the voltage value is outside the first target range.

The described measuring bridge arrangement allows a second method according to the invention for diagnosis of the signal processing, in particular in the measuring bridge, and also the integrity of the connections of the measuring bridge with the differential amplifier. The reference voltage divider here is advantageously dimensioned through the appropriate choice of resistance values so that the voltage value of the test signal that can be read at the test terminals is greater than the maximum bridge differential voltage Uamax arising as measuring signal in normal operation. Here, the voltage amplification G of the differential amplifier is to be dimensioned such that the maximum output voltage is smaller than the upper end of the output voltage operating range, advantageously in the vicinity of the upper end of the output voltage operating range, and the thus dimensioned output voltage especially advantageously defines the upper end of the output voltage operating range. Furthermore, the reference voltage divider and the measuring bridge are dimensioned via the appropriate choice of resistance values so that the voltage value of a common mode signal Ugt of the two half bridges is either greater than the voltage value at the first test terminal +UR by at least half of the amount of the maximum measuring differential voltage Uamax, or is smaller than the voltage value at the second test terminal −UR by at least half of the maximum measuring differential voltage Uamax.

In operation, the switches can be set for a test phase via the control signals to the test terminals and, after the sufficiently long charging time of the capacitors described above, a potential deviating from the common mode signal Ugt is present at the capacitors or at the amplifier inputs. Then the switches can be set for a measuring phase via the control signals to the measuring terminals. If the leads are intact, and after the above described sufficiently long charging time for the capacitor, a potential at the level of the common mode signal Ugt is established at the capacitors or at the amplifier input, superimposed by the current measuring differential voltage Ua. The amplified measuring signal is present at the amplifier output Vout and must lie above the lower end and under the upper end of the initial voltage working range. If this criterion is not satisfied, a second error state is present, which can also be caused in particular by a misadjusted or defective measuring bridge.

If one of the two signal lines from the measuring bridge to the differential amplifier is broken, the relevant amplifier input remains at the potential of the test terminal because of the capacitor charge. The other amplifier input takes on the potential of the measuring terminal. Because of the above dimensioning, a potential difference arises between the amplifier inputs that is greater than the maximum measuring differential voltage Uamax. Due to the voltage amplification G, there arises at the amplifier output a voltage outside of the initial voltage operating range, or the amplifier will be overdriven and will be brought "into account" with (that is, approach a limit set at) its starting value, i.e., to approximately the amplifier supply voltage (or reference voltage), or to ground potential, both of which can be seen as a third error state.

If both signal lines are broken, both relevant amplifier inputs remain at the voltage of the test connection because of the capacitor charges after switching from the test phase to the measuring phase, even though the test terminals are no longer connected. Through the voltage amplification, a voltage remains at the amplifier output that is then the first target range, which can be seen as a fourth error state.

Detected error states, in particular the first through fourth error states, can advantageously be stored together with the error circumstances, such as mode of operation and date/time, for purposes of additional or later processing. At the same time or with a delay, an alarm can be triggered and/or a change of operating state can take place, or signaling or data output can take place.

DETAILED DESCRIPTION

Figure 1:
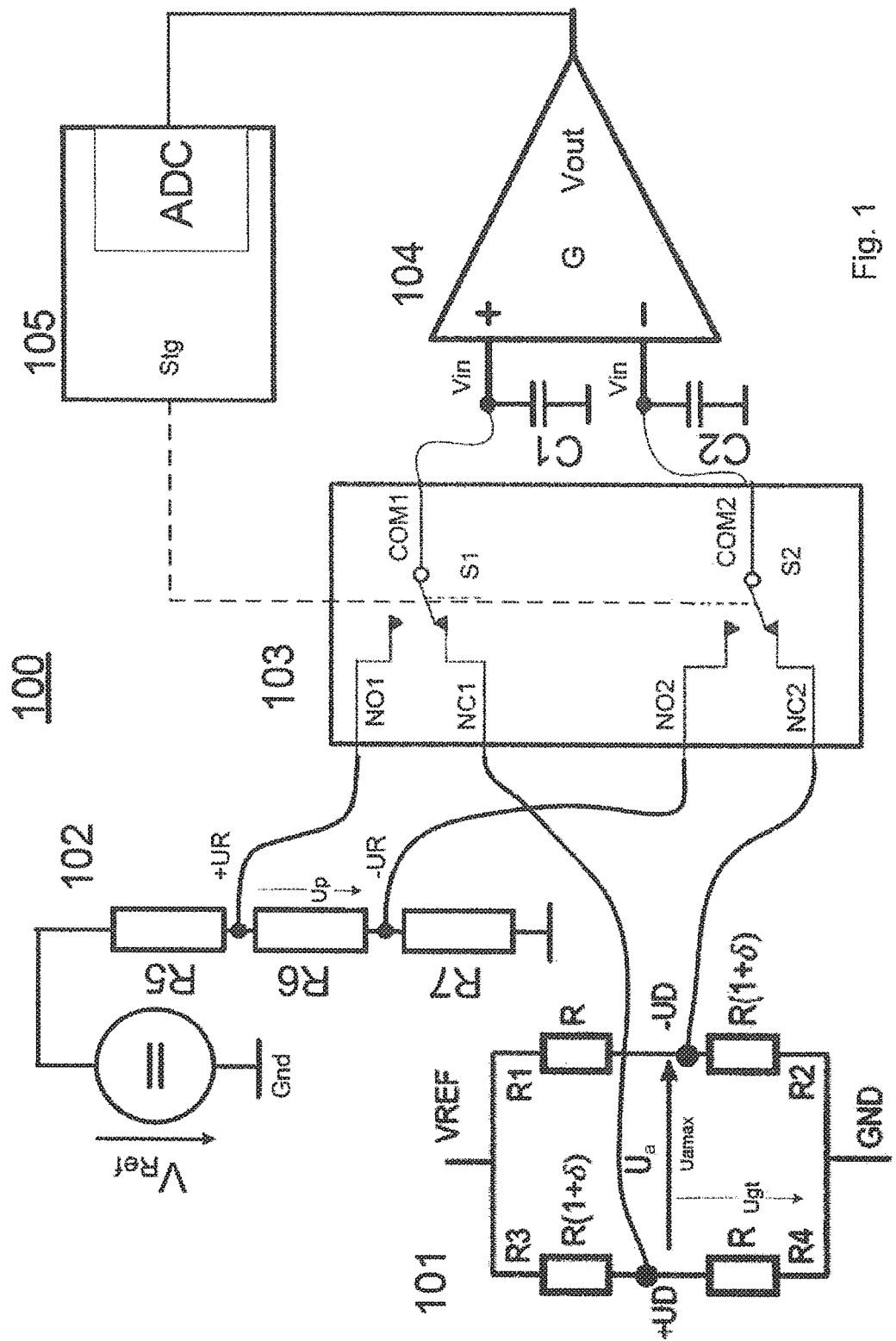
FIG. 1 schematically shows an embodiment of the measuring bridge arrangement according to the invention.

In correspondence with a first embodiment of the invention, FIG. 1 shows a measuring bridge arrangement 100 containing a measuring bridge 101, a reference voltage source Vref with reference voltage divider 102, a multiplexer 103 containing two controllable switches S1 and S2, a differential amplifier 104, whose inputs Vin+ and Vin− at the capacitors C1 and C2 are connected with respect to ground and which has an output Vout, a controller 105 containing an integrated analog-digital converter ADC, and a digital control output Stg.

The measuring bridge 101 is supplied with power by the reference potential Vref with respect to a ground Gnd. Two resistive elements R3 and R4 form a first half bridge having a measuring terminal +UD, where R4 has a fixed resistance value and R3 changes its resistance on the basis of a variable external physical quantity. Two additional resistive elements R1 and R2 form a second half bridge with a measuring terminal −UD, where R1 has a fixed resistance value and R2 changes its resistance on the basis of a variable external physical quantity. Preferably, the bridge is adjusted so that the bridge differential voltage Ua comes close to a zero value at minimal or maximal external values. The common mode voltage Ugt is established at the measuring terminals with respect to ground.

The reference voltage divider 102 is formed as a series circuit of the three resistors R5, R6, R7 and lies between ground Gnd and reference potential Vref. The test terminal +UR is between R5 and R6 and the test terminal −UR is between R6 and R7. A test voltage Up can be tapped between −UR and +UR.

The switch S1 in multiplexer 103 is connected by its common terminal COM1 to the noninverting amplifier input Vin+, its normally open contact NO1 is connected to the test terminal +UR, and its normally closed contact NC1 is connected to the measuring terminal +UD. The control line of the switch S1 is connected to an additional output of the controller 105. The switch S2 in multiplexer 103 is connected by its common connection COM2 to the inverting amplifier input Vin−, its normally open contact NO2 is connected to the test terminal −UR, and its normally closed contact NC2 is connected to the measuring terminal −UD. The control line of the switch S2 is connected to a digital output Stg of the controller 105.

The differential amplifier 104, preferably an integrated circuit of the instrument amplifier type, with the noninverting amplifier input Vin+ and the inverting amplifier input Vin−, has a voltage amplification G (gain), which can be determined by an external element, and an output Vout, which gives the difference of the potentials at the amplifier inputs multiplied by G, provided said value can be represented as a potential between ground and the amplifier supply voltage. The potential at Vout is sent to the analogous input of the analog-digital converter ADC in controller 105.

The controller 105 can be a hard-wired logic circuit, but preferably is a microcontroller or ASIC that implements a program-controlled logic system using conventional processing and storage components. The controller 105 in the embodiment that is shown controls the multiplexer 103 via the at least one digital output Stg and initiates the analog-digital conversion and the evaluation and processing of the changed measurement value.

Figure 2:
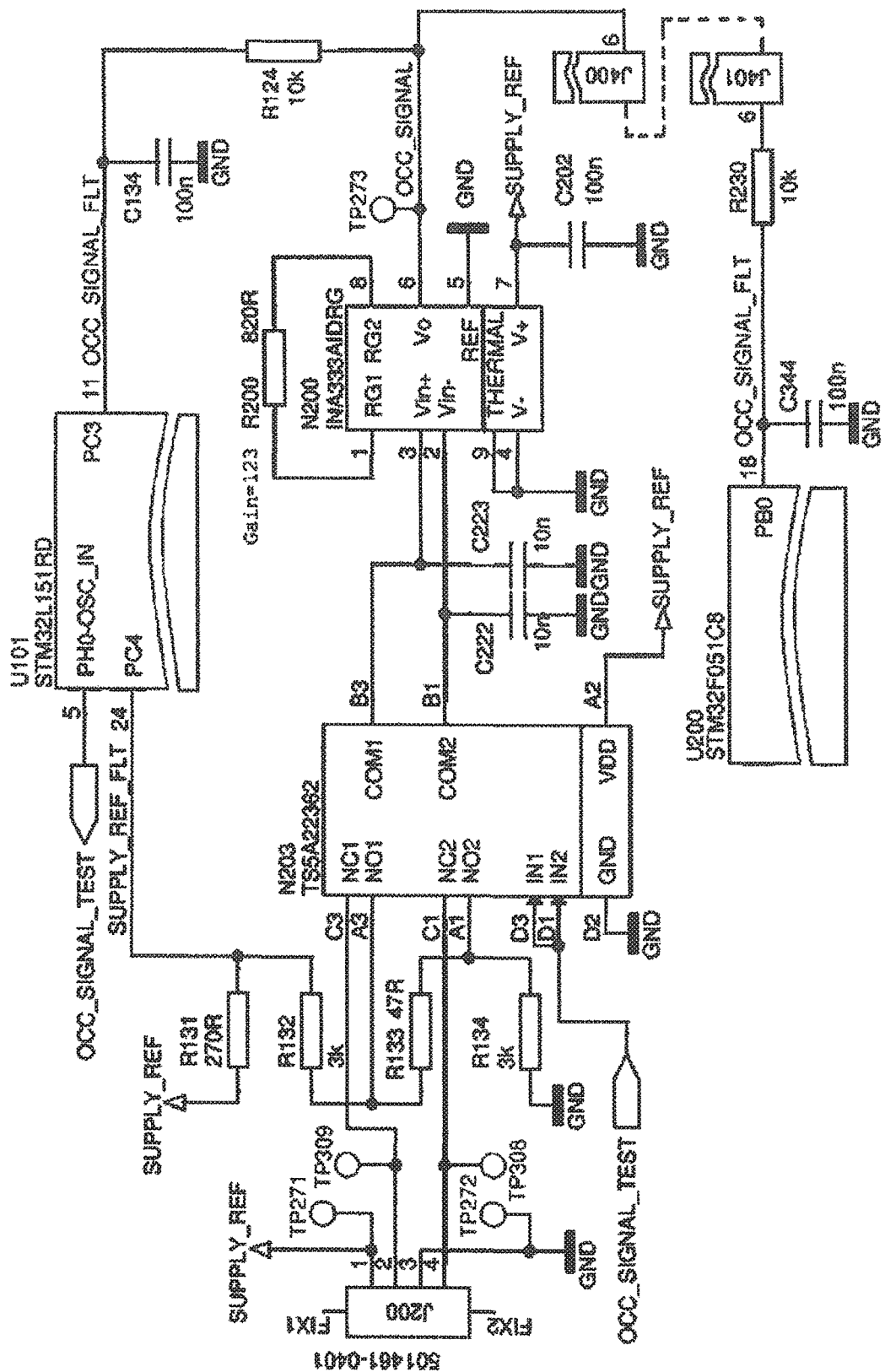
FIG. 2 schematically shows a preferred embodiment of the signal evaluation for a measuring bridge.

In correspondence with a second, preferred embodiment of the invention, FIG. 2 shows a detachable terminal J200 for the measuring bridge (not shown here; see FIG. 1), a reference voltage supply SUPPLY_REF with reference voltage divider consisting of the resistors R132, R133, R134, a multiplexer N203 containing two controllable switches, a differential amplifier N200, whose inputs Vin+ and Vin− are connected to the capacitors C223 and C222 with respect to ground and which has an output Vo, and a controller U101 containing an integrated analog-digital converter.

The function and structure of the second embodiment correspond in principle to the first embodiment. The concrete dimensions given below are intended to illustrate aspects of the invention and represent only one possible embodiment. The measuring bridge (not pictured in FIG. 2; see FIG. 1) is connected to the connector J200. The analog multiplexer N203 has two integrated, two-pole, low-resistance switches with low cross talk. The line OCC_SIGNAL_TEST leads the control signal of the master processor U101 to the control input of the analog multiplexer N203. If OCC_SIGNAL_TEST=Low, the inputs NC are connected to the outputs COM, and the inputs NO are open. If OCC_SIGNAL_TEST=High, the inputs NO are connected to the outputs COM, and the inputs NC are open.

R131 to R134 form a voltage divider circuit at the reference potential SUPPLY_REF, for example 3.0 V. A differential voltage of 22.3 mV with a common mode level of 1.425 V is generated at R133. The two potentials of R133 are sent to the NO1 and NO2 terminals of the analog multiplexer N203. If OCC_SIGNAL_TEST=High, the test signal generated with the voltage divider circuit is present at the two inputs of the amplifier N200. At the set amplification with a Gain=123, N200 generates a reference signal of about 2.75 V. If OCC_SIGNAL_TEST=Low, the two output signals of the measuring bridge are present at the inputs of the amplifier N200. In this mode, the circuit corresponds to the otherwise normal basic circuit for evaluation of the measuring bridge output signals.

The two capacitors C222 and C223 serve for error detection in the case of a breakage of one or more of the connecting lines to the measuring bridge. The mode of operation is as follows: First, the test signal is evaluated. Through this, the two capacitors obtain a defined potential in the region of the common mode level of about 1.425 V.

When the multiplexer is switched, the two capacitors, if the connection is intact, take, in a very short time, the potential of the low-resistance measuring bridge as measuring differential voltage with a common mode level of about 1.5 V. The amplified measuring differential voltage is present at the output of N200. On the other hand, if a signal line is broken, the potential of the affected capacitor remains at the original level. For this reason, a comparably high differential voltage of about 75 mV is initiated at the amplifier input, which takes the instrument amplifier N200, with Gain=123, "into account" with (or approach ground GND 0 V or reference voltage SUPPLY_REF 3 V).

If there is a breakage of both measuring bridge signal lines, the test signal at the output of N200 remains the same. Compared to the normal measuring values, this has an unacceptably high value.

The output voltage OCC_SIGNAL of the differential amplifier is sent to the analog-digital converter in controller U101 via an analogous low-pass R124, C134. Alternatively, or in addition, the output voltage OCC_SIGNAL can also be sent to a second independent filtering and further processing in additional controller components R230, C344, connecting with controller U200.

The invention claimed is:

1. A method for error detection in a measuring bridge arrangement comprising:
    a measuring bridge with at least one first half bridge with at least one first measuring terminal, and a second half bridge with a second measuring terminal;
    a reference voltage divider with at least one first and one second test terminal; and
    a differential amplifier with at least one first and one second amplifier input and at least one amplifier output and with a voltage amplification value (G) and an output voltage working range;
    wherein the first amplifier input is connected to a first capacitor and the second amplifier input is connected to a second capacitor and the first and second amplifier inputs are selectively connectable with the measuring terminals or the test terminals, and
    wherein, in a measuring phase, a first switch connects the first measuring terminal, and in a test phase, connects the first test terminal, to the first amplifier input, and in the measuring phase, a second switch connects the second measuring terminal, and in the test phase, connects the second test terminal, to the second amplifier input,
comprising the following steps:
    application of a reference potential to the measuring bridge and the reference voltage divider;
    providing a first target range for plausible values of a differential voltage between the first test terminal and the second test terminal multiplied by the voltage amplification (G);
    setting a test phase by means of the switches; and
    detection of an error state if a voltage value at the amplifier output is outside of the first target range.

2. A method for error detection as in claim 1, further comprising the following steps:
    providing a second target range for plausible values of a differential voltage between the first measuring terminal and the second measuring terminal multiplied by the voltage amplification (G);
    setting a measuring phase by means of the switches;
    waiting a time that amounts to a multiple of a second time constant, which results in each case from the capacitance of the first and second capacitors and the internal resistance of the first and second half bridges, but a multiple that is smaller than that of first time constants, which result in each case from the capacitance of the first and second capacitors and the internal resistance of the first and second amplifier inputs; and
    detection of an error state when a voltage value at the amplifier output lies outside the second target range or within the first target range.

3. A method for error detection as in claim 1, further comprising the following steps: storage of the error state or states and error circumstances for purposes of additional processing and/or triggering of an alarm and/or signaling a change of operating state.

4. A method for error detection as in claim 2, further comprising the following steps: storage of the error state or states and error circumstances for purposes of additional processing and/or triggering of an alarm and/or signaling a change of operating state.

5. A method as in claim 1, wherein the method is encoded in a computer program, which is implemented by a controller.

6. A method as in claim 1, wherein the method is implemented in a device for parenteral administration of a medication.

7. A device for parenteral administration of a medication, the device comprising a measuring bridge arrangement configured for detecting an error state in an administration path comprising:
    a measuring bridge with at least one first half bridge with at least one first measuring terminal, and a second half bridge with a second measuring terminal;
    a reference voltage divider with at least one first and one second test terminal; and
    a differential amplifier with at least one first and one second amplifier input and at least one amplifier output and with a voltage amplification value (G) and an output voltage working range;
    wherein the first amplifier input is connected to a first capacitor and the second amplifier input is connected to a second capacitor and the first and second amplifier inputs are selectively connectable with the measuring terminals or the test terminals to diagnose at least a first and a second error state affecting signal processing relating to administration of the medication.

8. The device of claim 7, wherein, in a measuring phase, a first switch connects the first measuring terminal, and in a test phase, connects the first test terminal, to the first amplifier input, and in the measuring phase, a second switch connects the second measuring terminal, and in the test phase, connects the second test terminal, to the second amplifier input.

9. The device of claim 8, wherein the measuring bridge and the reference voltage divider are operated with a reference potential with respect to a ground, and where a value of a maximum measuring differential voltage between the first measuring terminal and the second measuring terminal multiplied by the voltage amplification value and a value of a reference differential voltage between the first test terminal and the second test terminal multiplied by the voltage amplification value takes values within a starting voltage operating range of the differential amplifier.

10. The device of claim 9, wherein a voltage value of a common mode signal of the two half bridges is greater by at least half the amount of the maximum measuring differential voltage than a voltage value at the first test terminal, or is less than a voltage value at the second test terminal by at least half the amount of the maximum measuring differential voltage.

11. The device of claim 10, wherein first time constant values, which each result from the capacitance of the first and second capacitors and the internal resistance of the first and second amplifier inputs, are considerably greater than second time constant values, which each result from the capacitance of the first and second capacitors and the internal resistance of the first and second half bridges.

12. The device of claim 11, wherein a controller sets the measuring phase and test phase state of the first and second switches via a control signal, and in doing so can evaluate a relevant voltage value at the amplifier output.

13. The device of claim 12, wherein the controller implements a computer program providing the control and performing the evaluation.

14. The device of claim 12, wherein the controller implements a computer program providing the control signal and performing the evaluation of the relevant voltage value at the amplifier output, to diagnose a first signal processing error state, in particular of the differential amplifier and the analog-digital converter, as well as the integrity of the connections of these elements.

15. The device of claim 12, wherein the controller implements a computer program providing the control signal and performing the evaluation of the relevant voltage value at the amplifier output, to diagnose a second error state, in particular one caused by a misadjusted or defective measuring bridge.

16. The device of claim 12, wherein the controller implements a computer program providing the control signal and performing the evaluation of the relevant voltage value at the amplifier output, to diagnose a third error state when one of two signal lines from the at least one first half bridge with at least one first measuring terminal, and the second half bridge with a second measuring terminal to the differential amplifier is broken.

17. The device of claim 12, wherein the controller implements a computer program providing the control signal and performing the evaluation of the relevant voltage value at the amplifier output, to diagnose a fourth error state when both of the two signal lines are broken.

* * * * *